(12) United States Patent
Buffet et al.

(10) Patent No.: US 6,495,911 B1
(45) Date of Patent: Dec. 17, 2002

(54) SCALABLE HIGH FREQUENCY INTEGRATED CIRCUIT PACKAGE

(75) Inventors: Patrick H. Buffet, Essex Junction, VT (US); Paul Lee Clouser, Shelburne, VT (US); Danny Marvin Neal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/640,544

(22) Filed: Aug. 17, 2000

(51) Int. Cl.[7] ............................................. H01L 23/12
(52) U.S. Cl. ...................... 257/700; 257/698; 257/691; 257/773; 257/659; 257/774
(58) Field of Search ................................. 257/659, 691, 257/698, 700, 773, 774

(56) References Cited

U.S. PATENT DOCUMENTS 5,925,925 A * 7/1999 Dehaine et al. ............. 257/659
6,359,341 B1 * 3/2002 Huang et al. ............... 257/778

* cited by examiner

*Primary Examiner*—David L. Talbott
*Assistant Examiner*—Luan Thai
(74) *Attorney, Agent, or Firm*—Robert V. Wilder; Mark E. McBurney

(57) ABSTRACT

A method and implementing system are described in which a tri-plate chip carrier is effective to significantly reduce electromagnetic signal radiation and provide enhanced noise immunity. The tri-plate structure includes a ground layer, a middle signal conducting layer upon which an integrated circuit is mounted, and a top reference potential layer. The middle layer includes groups of printed circuit conductors extending from the chip to the outer edges of the carrier. The top layer is arranged to have separate electrically isolated conducting areas for VDD and ground reference potential connections. The conducting areas are arranged such that each group of signal conductors in the middle signal layer has a ground potential area above it and a ground potential area below it to provide enhanced signal isolation and reduced electromagnetic radiation.

11 Claims, 4 Drawing Sheets

SCALABLE HIGH FREQUENCY INTEGRATED CIRCUIT PACKAGE

FIELD OF THE INVENTION

The present invention relates generally to information processing systems and more particularly to a methodology and implementation for signal transmission in an integrated circuit carrier package.

RELATED APPLICATIONS

Subject matter disclosed and not claimed herein is disclosed and claimed in one or more of the following related co-pending applications, which are assigned to the assignee of the present application and included herein by reference:

Ser. No. 09/640,539;

Ser. No. 09/640,538; and

Ser. No. 09/640,512.

BACKGROUND OF THE INVENTION

In digital computer assemblies, including integrated circuit (IC) or chip carrier packages, it has become common practice over the years to sandwich a logic signal (SIG) transmission line between two reference planes, i.e. between a power (VDD) reference plane and a power return ground (GND) reference plane, while transmitting the logic signal from a driver circuit to one or more receiver circuits. With regard to a chip carrier in particular, the minimum that a chip package carrier must supply to a chip mounted thereon is one or more power supply voltages (VDD), one or more ground returns (GND), and a sufficient number of signal (SIG) lines. Currently these requirements are furnished by means of sets of separate planes for VDD, SIG and GND connections to the mounted chip. In other words, a plane of signal lines is defined on a SIG plane that is positioned or "sandwiched" between a GND plane and a voltage VDD plane. The semiconductor chip sits on top at the center of the package. The signal lines radiate outwardly from the chip area and connect to the card area below the carrier "sandwich" which is made up of the three reference planes. De-coupling capacitors on the chip and the chip carrier between VDD and GND supply the electrical charge current at the low source inductance needed to drive fast transitions into the signal lines at the chip source end. While this construction has been satisfactory in the past, increasing operating frequencies of systems and chips has created problems with regard to signal isolation and noise immunity.

Thus there is a need for an improved chip carrier package design which provides greater signal isolation and noise immunity in systems and chips having high operating frequencies.

SUMMARY OF THE INVENTION

A method and implementing system are provided in which a tri-plate structure is arranged to include three substrate layers surrounding an integrated circuit chip which is mounted thereon. In an exemplary embodiment, the tri-plate structure includes a middle or signal layer, a first outer layer or top layer, and a second outer layer or bottom layer. The first and second outer layers are positioned on each side of the signal layer. The three layers are arranged on electrically insulative material and the three layers are sandwiched together to form a chip carrier. The chip is mounted on the middle layer or signal (SIG) layer and extends through an opening in the top layer. The middle signal layer includes bundles or groups of printed circuit conductors or lines to carry signals between the chip and the edges of the carrier device. The first outer layer includes electrically isolated and separate conducting areas or segments which are held at different system potentials, for example at ground (GND) and VDD power potential levels. The separate conducting areas on the top layer are separated by air gaps or by insulative material to provide adequate electrical isolation. The separate areas are arranged on the first outer layer relative to the signal conductors in the middle layer such that signal lines from the chip to the outer edges of the chip carrier in the middle layer are positioned under areas of ground potential in the first outer layer and above the grounded second outer layer which is positioned below the signal layer in the carrier device. Thus, each group of signal conductors in the middle layer between the chip and the outer edges of the carrier have a ground potential area or segment above each signal conductor group and also a ground potential layer below each signal conductor group. The tri-plate structure thus formed provides system electromagnetic radiation isolation and enhanced noise isolation and signal integrity. In the example, ground areas in the top layer are connected to the bottom ground potential layer through vias which pass through the middle layer. Also, vias are used to connect de-coupling capacitors between VDD areas in the top layer and the ground potential bottom layer.

BRIEF DESCRIPTION OF THE DRAWINGS

A better understanding of the present invention can be obtained when the following detailed description is considered in conjunction with the following drawings, in which.

DETAILED DESCRIPTION

Figure 1:
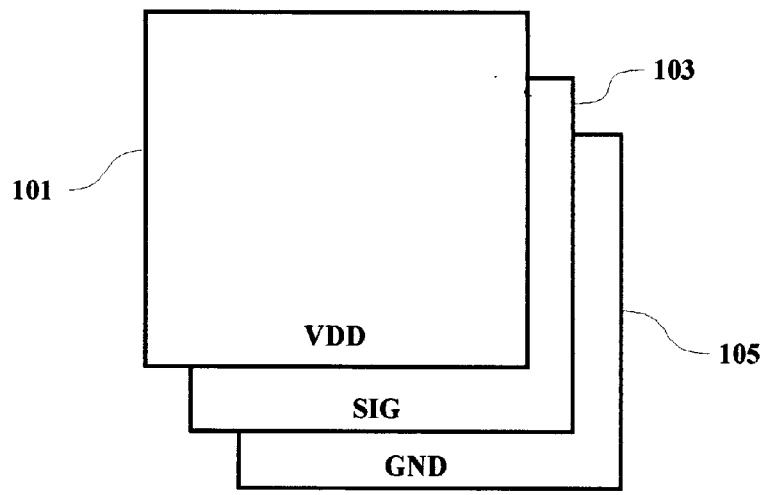
FIG. 1 is a schematic diagram of a prior art arrangement of reference voltage planes in a chip carrier.

The various methods discussed herein may be implemented on a chip carrier in any electronic system which includes integrated circuit packages carried on chip carrier packages. As shown in FIG. 1, a typical prior art arrangement of reference planes in a chip carrier package includes a SIG plane 103 positioned between a VDD reference plane 101 and a GND reference plane 105. The Sig plane 103 includes signal lines for conducting signals between drivers and receivers which are included within an integrated circuit or chip mounted on the carrier and also to receivers mounted on other carriers in an electronic system. The power plane is maintained at a reference VDD power potential.

Figure 2:
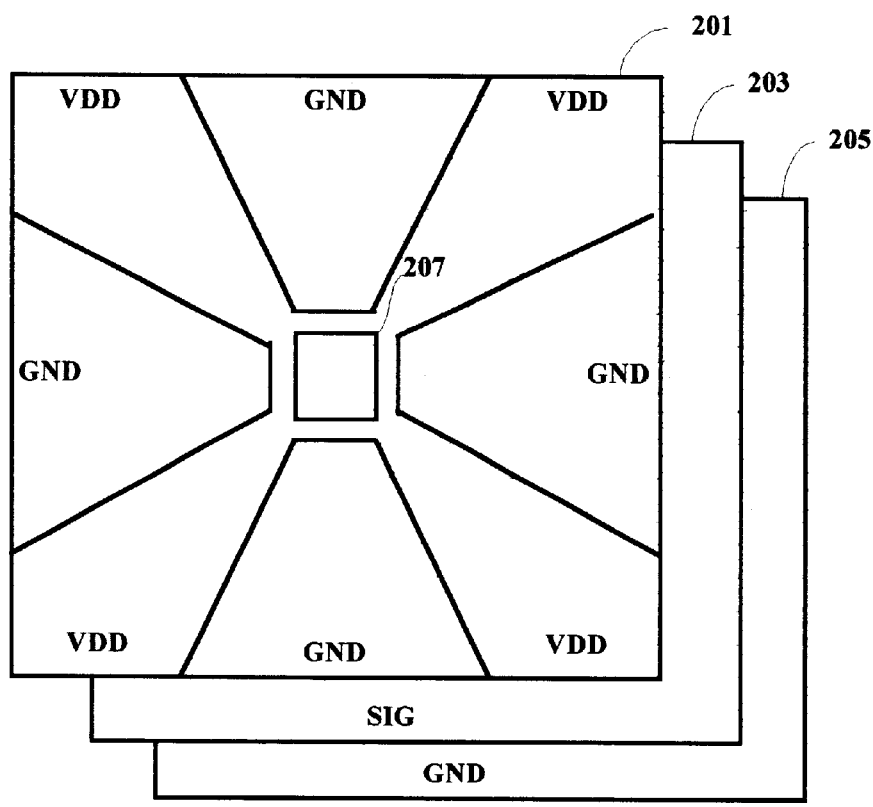
FIG. 2 is a schematic diagram of an exemplary carrier design showing a planar layout with separated areas for different potentials in the same plane in accordance with the present invention.

An exemplary embodiment of the present invention is illustrated in FIG. 2. As shown, a chip carrier includes three substrate layers 201, 203, and 205. The top layer 201 is divided into separate areas for connections to VDD and GND potentials. In the example, the VDD areas or segments are joined together to provide a continuous conducting surface at VDD in the example. The GND areas or segments are separate and electrically isolated from the VDD areas. An integrated circuit or chip (FIG. 4) is centrally mounted on the middle layer 203 and extends through an opening 207 the top layer 201. The middle or signal layer 203 is sandwiched between the first and second layers 201 and 205, respectively. The middle or signal layer 203 is arranged to have multiple high frequency signal conductors thereon (FIG. 5) separated by insulation material. The arrangement of the SIG layer 203 between the first and second layers as shown provides enhanced signal isolation and noise immunity. Logic signals which are generated by a chip mounted on the chip carrier are connected to various conductors in the SIG layer for transmission to other chips or other parts of the chip. When signals are carried on the SIG plane between the separate GND areas in the top and bottom layers, the signals are effectively isolated by the GND sections over and below the signal lines carrying the signals in the SIG plane. Thus, signal isolation by signal transmission through signal lines sandwiched between and isolated by GND potential layers is achieved at the chip carrier level as illustrated.

An indefinite number of VDD/GND patterns on the carrier planes is available for carrier plane construction in accordance with the present invention. So long as one or more of the signal lines in the SIG plane are overlapped at the top and bottom of the SIG plane by GND layers or patches, signal isolation can be achieved.

Figure 3:
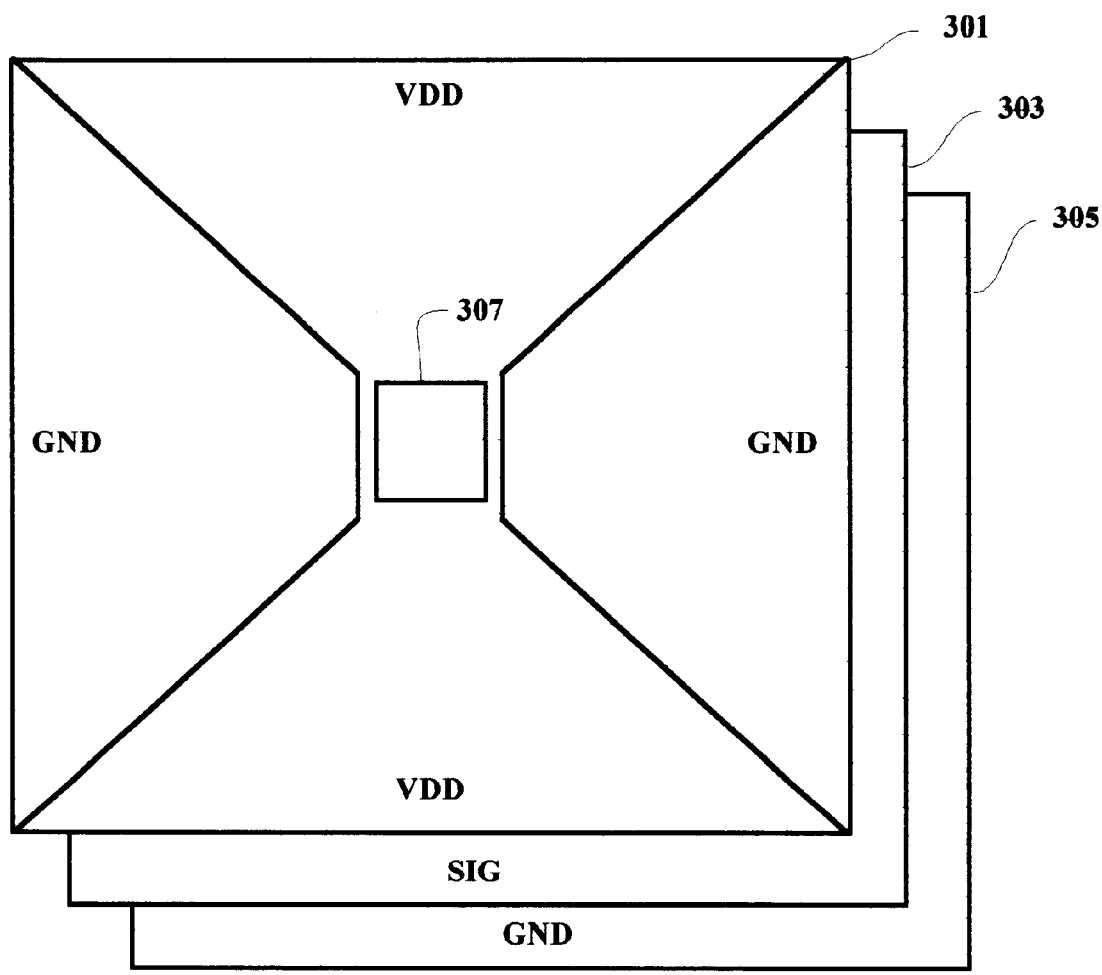
FIG. 3 is an illustration showing another exemplary carrier design showing a planar layout with separated areas for different potentials in the same plane in accordance with the present invention.

A second of many possible patterns for VDD/GND layouts on the outer layers of a chip carrier is illustrated in FIG. 3. In the FIG. 3 embodiment, top and bottom substrate layers 301 and 305, respectively, are illustrated with a SIG layer 303 sandwiched in-between the outer layers 301 and 305. The carrier is arranged to have a chip mounted on the middle substrate layer 303 which extends through an opening 307 in the top layer 301. In FIG. 3, there are only two GND areas on the surface of the top layer 301 rather than four GND areas as shown in FIG. 2. However, in FIG. 3 the GND areas are larger and more contiguous thereby providing a greater area for isolation of the signals being transmitted on the SIG plane 303. As with FIG. 2, the layout on the bottom layer 305 is a continuous surface held at ground. The design of the layout on the top and bottom layers can be modified to best accommodate and isolate different chips since the signals and terminals may be positioned differently on different chips and the GND sections on the outer layers can be customized to match the layout of the SIG lines connected to specific chips.

Figure 4:
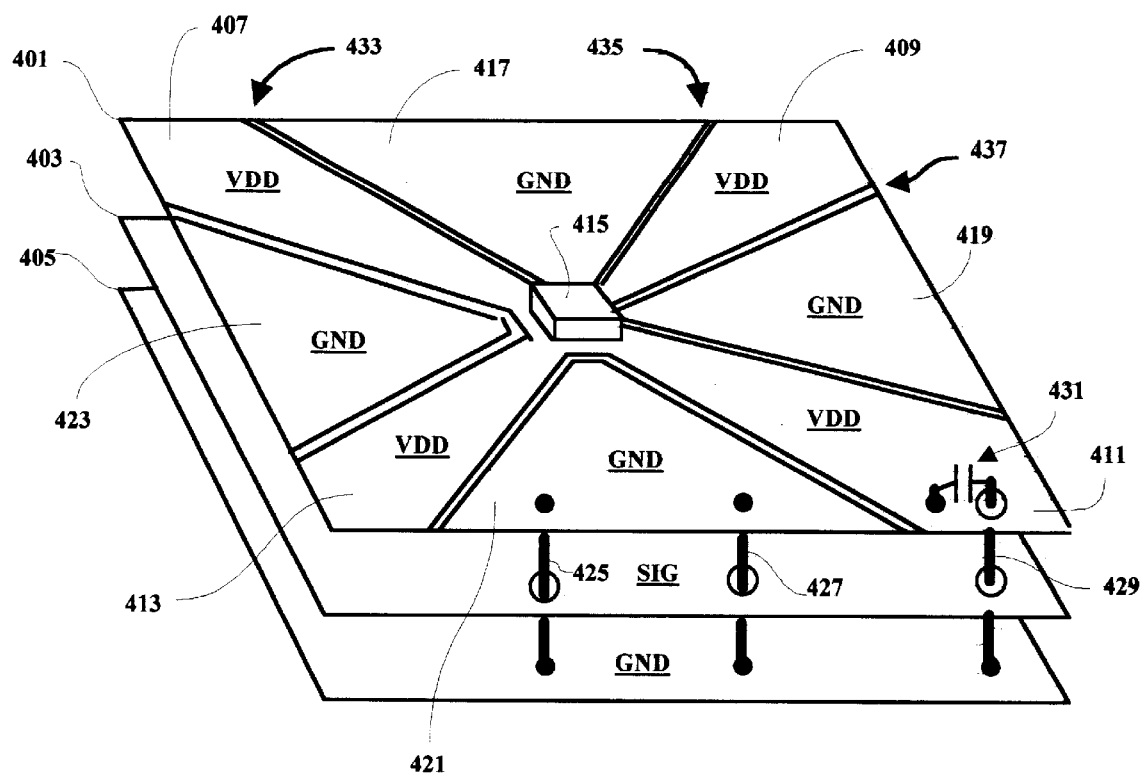
FIG. 4 is a perspective view of the chip carrier arrangement shown in FIG. 2.

In FIG. 4, a more detailed exploded view of the chip carrier is presented. As shown, a tri-plate structure is arranged to include three substrate layers 401, 403 and 405 surrounding an integrated circuit chip 415 which is mounted thereon. In an exemplary embodiment, the tri-plate structure includes a top or first layer 401, a middle or second layer 403 and a bottom or third layer 405. In the example, each layer is arranged on electrically insulative substrate material such as FR4 material which is known in the art and typically used for circuit boards, although other insulative materials may also be used. The three substrate layers 401, 403 and 405 are sandwiched together to form a chip carrier. The chip 415 is mounted on the middle substrate layer or signal (SIG) layer 403 and extends through an opening in the top layer 401. The middle signal layer 403 includes bundles or groups of printed circuit wiring or lines (FIG. 5) to carry signals between the chip 415 and the edges of the carrier device. The top or reference potential layer 401 includes electrically isolated and separate conducting areas or segments which are held at different system potentials. For example, segments 417, 419, 421 and 423 are held at ground (GND) potential, and segments 407, 409, 411 and 413, which are joined together to form a single electrical node, are held at VDD power potential level. The separate conducting areas on the top layer 401 are separated by air gaps, e.g. 433, 435, 437, or by insulative material, to provide adequate electrical isolation between the different segments of electrical potential. The separate areas are arranged on the top layer 401 relative to the signal conductors in the middle layer (FIG. 5) such that signal lines from the chip 415 to the outer edges of the chip carrier in the middle layer 403 are positioned under areas of ground potential such as 423 in the top layer, and above the grounded bottom or third layer 405 in the carrier device. Thus, each group of signal conductors in the middle layer 403 between the chip and the outer edges of the carrier have a ground potential area or segment, e.g. 417, 419, 421 or 423, above each signal conductor group and also a ground potential layer below each signal conductor group in the bottom layer 405. The tri-plate structure thus formed provides system electromagnetic radiation isolation and enhanced noise isolation and signal integrity. In the example, ground areas in the top layer 401 are connected to the bottom ground potential layer 405 through vias, e.g. 425, 427, which pass through the middle layer 403. Also, vias such as via 429 are used to connect de-coupling capacitors 431 between VDD areas 411 in the top layer 401 and the ground potential bottom layer 405.

Figure 5:
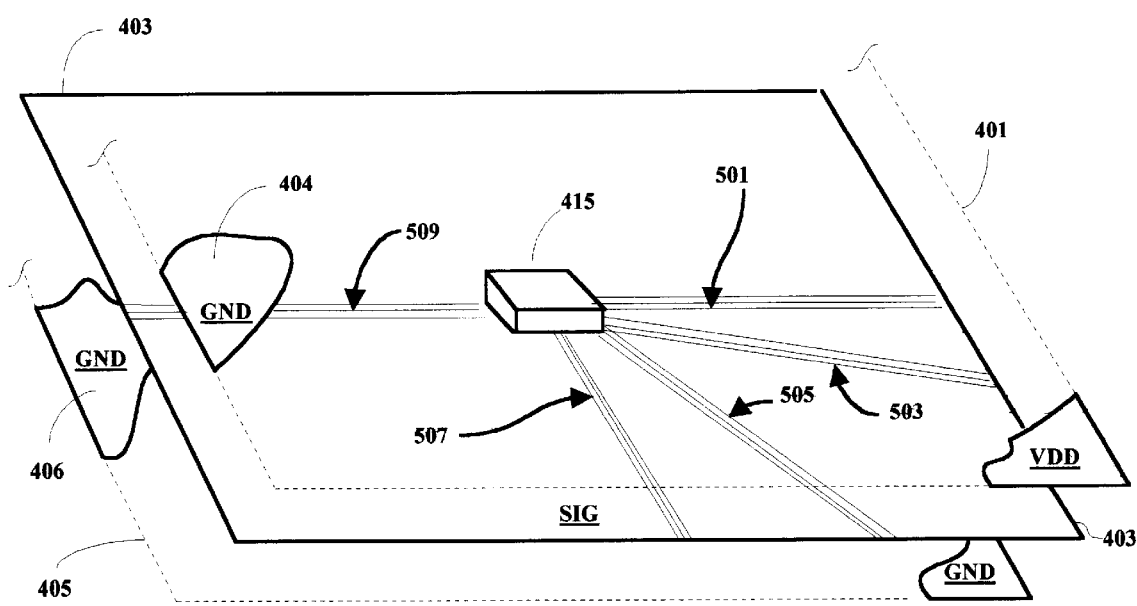
FIG. 5 is an illustration showing details of the middLe layer of the tri-plate chip carrier package illustrated in FIG. 4.

In FIG. 5, a more detailed showing of the middle layer 403 is presented. As shown, layer 403 is positioned between the top layer 401 and the bottom layer 405. The SIG or middle layer 403 includes groups of signal conductors, such as 501, 503, 505, 507 and 509, which are positioned between areas in the top layer 401 and bottom layer 405 which are held at ground potential such that each group of signal conductors such as 509 is sandwiched between ground potential areas, for example areas 404 and 406, in extending from the chip 415 to the outer edges of the chip carrier.

It is noted that the signals that radiate outwardly under the patches of GND are launched into true GND-SIG-GND tri-plate carrier construction. The desirable GND-GND reference integrity of the tri-plate condition can be maintained in the carrier package to the card upon which the carrier is mounted, and continued all the way through the total interconnect system of cards, boards, back-planes, unit interconnect cables and network interconnect cables to the corresponding similarly constructed tri-plate package containing a chip with the intended receiver of signals transmitted from the driver on the first chip.

It is noted that the FIG. 2 embodiment often requires package de-coupling capacitors at the corners of the chip while the FIG. 3 embodiment would accommodate de-coupling capacitors along the top and bottom edges of the chip area, with high speed signals propagating on the GND-SIG-GND tri-plate to the left and to the right of the chip. Slower control signals could operate in the capacitively de-coupled VDD-GND area under the VDD part of the top layer.

The present invention, in addition to providing signal isolation and noise immunity, also provides significant wiring advantages over mixed VDD-GND references since the VDD distribution is now a low frequency system and is no longer coupled along its length to the high frequency signal system. This allows single-ended transmissions to scale to higher frequencies. This doubles the number of signal lines in those frequency ranges where differential transmission has been required to counteract the effects of electrical noise on the reference planes. Further, the distribution system for VDD no longer needs to be high frequency interleaved with the signal escape system. It can be placed out of the way to the corners or along selected edges of the package. This yields significant advantages in wiring the package and the card underneath the package, as well as the entire interconnect system. Moreover, the distribution system for VDD no longer needs to be high frequency interleaved with the GND system. This leads to the VDD distribution system being composed of more continuous conductors for lower DC loss. With this construction, signals are launched into true GND-GND reference integrity of the tri-plate structure, and that voltage reference integrity can be maintained from a driver in one chip through the carrier package to the card below the carrier and all the way through the interconnect system of cards, boards, backplanes, unit interconnect cables and network interconnect cables to a corresponding and similarly constructed tri-plate package containing a chip with a target receiver.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. An integrated circuit package comprising:
   a signal substrate layer arranged for having an integrated circuit mounted thereon;
   at least one group of signal conductors on said signal substrate layer arranged to be connected between terminals of said integrated circuit and at least one edge of said signal substrate layer;
   a first outer substrate layer positioned on a first side of said signal substrate layer; and
   a second outer substrate layer positioned on a second side of said signal substrate layer, said signal substrate layer being positioned between said first outer substrate layer and said second outer substrate layer, said first and second outer substrate layers being arranged to have first areas of conducting surfaces thereon connected to a first potential level, said first areas of conducting surfaces being positioned to extend with said group of said signal conductors on at least two sides of said group of said signal conductors.

2. The integrated circuit package as set forth in claim 1 wherein said first potential level is ground potential.

3. The integrated circuit package as set forth in claim 1 and further including:
   second areas of conducting surfaces positioned on said first outer substrate layer, said second areas of conducting surface being arranged for connection to a second potential level, said second potential level being different from said first potential level.

4. The integrated circuit package as set forth in claim 3 wherein said second potential level is a power supply potential.

5. The integrated circuit package as set forth in claim 3 and further including at least one de-coupling capacitor connected between one of said first areas of conducting surface on said first outer substrate layer and at least one of said second areas of conducting surface on said second outer substrate layer.

6. The integrated circuit package as set forth in claim 5 wherein said first areas of conducting surfaces on said first outer substrate layer are connected to first areas of conducting surfaces on said second outer substrate layer through vias passing through said signal substrate layer.

7. The integrated circuit package as set forth in claim 1 wherein said first areas of conducting surfaces are arranged symmetrically on said first outer substrate layer.

8. The integrated circuit package as set forth in claim 1 wherein said first areas of conducting surfaces comprise electrically isolated areas of conductive material on said first outer substrate layer, and said first areas of conducting surfaces are connected to conducting areas on said second outer substrate layer through vias passing through said signal substrate layer.

9. The integrated circuit package as set forth in claim 1 wherein said one group of signal conductors is arranged between said integrated circuit and only one edge of said signal substrate layer.

10. The integrated circuit package as set forth in claim 1 wherein said one group of signal conductors is arranged between said integrated circuit and only two edges of said signal substrate layer.

11. The integrated circuit package as set forth in claim 1 wherein said one group of signal conductors is arranged between said integrated circuit and all edges of said signal substrate layer.

* * * * *